(12) United States Patent
Kawanaka

(10) Patent No.: US 7,061,049 B2
(45) Date of Patent: Jun. 13, 2006

(54) SEMICONDUCTOR DEVICE USING SOI DEVICE AND SEMICONDUCTOR INTEGRATED CIRCUIT USING THE SEMICONDUCTOR DEVICE

(75) Inventor: Shigeru Kawanaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 310 days.

(21) Appl. No.: 10/166,389

(22) Filed: Jun. 11, 2002

(65) Prior Publication Data

US 2002/0190320 A1 Dec. 19, 2002

(30) Foreign Application Priority Data

Jun. 12, 2001 (JP) .............................. 2001-176542

(51) Int. Cl.
*H01L 27/01* (2006.01)

(52) U.S. Cl. ...................... 257/347; 257/348; 257/349; 257/350; 257/353

(58) Field of Classification Search ........ 257/347–350, 257/353; 438/149, 479, 517, 5
See application file for complete search history.

(56) References Cited

U.S. PATENT DOCUMENTS

| 5,057,704 | A | * | 10/1991 | Koyanagi et al. ............ 327/534 |
| 5,280,455 | A | * | 1/1994 | Kanaishi ..................... 365/229 |
| 5,578,865 | A | * | 11/1996 | Vu et al. ..................... 257/611 |
| 5,698,869 | A | * | 12/1997 | Yoshimi et al. ............. 257/192 |
| 5,818,781 | A | * | 10/1998 | Estakhri et al. ............. 365/226 |
| 5,869,359 | A | * | 2/1999 | Prabhakar ................... 438/149 |
| 5,892,263 | A | * | 4/1999 | Tachiyama .................. 257/370 |
| 6,087,893 | A | * | 7/2000 | Oowaki et al. .............. 327/537 |
| 6,100,563 | A | * | 8/2000 | Arimoto ...................... 257/347 |
| 6,153,914 | A | * | 11/2000 | Mulatti et al. ............... 257/372 |
| 6,160,291 | A | * | 12/2000 | Imai ............................ 257/347 |
| 6,160,292 | A | * | 12/2000 | Flaker et al. ................ 257/347 |
| 6,342,717 | B1 | * | 1/2002 | Komatsu ..................... 257/347 |
| 6,429,054 | B1 | * | 8/2002 | Krishnan et al. ........... 438/149 |
| 6,429,495 | B1 | * | 8/2002 | Ooishi et al. ............... 257/393 |
| 6,441,434 | B1 | * | 8/2002 | Long et al. .................. 257/347 |

(Continued)

FOREIGN PATENT DOCUMENTS

JP          9-321259          12/1997

OTHER PUBLICATIONS

F. Assaderaghi, et al., 1996 Symposium on VLSI Technology Digest of Technical Papers, pp. 122-123, "History Dependence of Non-Fully Depleted (NFD) Digital SOI Circuits", 1996.

*Primary Examiner*—Eugene Lee
(74) *Attorney, Agent, or Firm*—Oblon, Spivak, McClelland, Maier & Neustadt, P.C.

(57) ABSTRACT

A semiconductor device includes a semiconductor layer provided on a semiconductor substrate with an insulating film interposed therebetween. A gate electrode is provided on the semiconductor layer with a gate insulating film interposed therebetween, and a pair of source/drain regions are formed in the semiconductor layer so as to hold a body region under the gate electrode therebetween. A control section supplies voltages to the source/drain regions. The control section supplies the body region in an OFF state and ON state with a first voltage and a second voltage different from the first voltage, respectively. The second voltage is set such that a potential of the body region in the OFF state is substantially the same as a potential of the body region in the ON state.

10 Claims, 6 Drawing Sheets

U.S. PATENT DOCUMENTS

| | | | |
|---|---|---|---|
| 6,441,436 B1 * | 8/2002 | Wu et al. | 257/350 |
| 6,466,082 B1 * | 10/2002 | Krishnan | 327/543 |
| 6,472,684 B1 * | 10/2002 | Yamazaki et al. | 257/72 |
| 6,583,474 B1 * | 6/2003 | Yamazaki et al. | 257/354 |
| 6,603,175 B1 * | 8/2003 | Kadowaki et al. | 257/347 |
| 6,674,127 B1 * | 1/2004 | Kotani | 257/347 |
| 6,690,056 B1 * | 2/2004 | Reedy et al. | 257/314 |
| 6,734,498 B1 * | 5/2004 | Keshavarzi et al. | 257/347 |
| 6,787,851 B1 * | 9/2004 | Hogyoku | 257/347 |
| 6,900,499 B1 * | 5/2005 | Yamazaki et al. | 257/314 |

* cited by examiner

SEMICONDUCTOR DEVICE USING SOI DEVICE AND SEMICONDUCTOR INTEGRATED CIRCUIT USING THE SEMICONDUCTOR DEVICE

CROSS-REFERENCE TO RELATED APPLICATIONS

This application is based upon and claims the benefit of priority from the prior Japanese Patent Application No. 2001-176542, filed Jun. 12, 2001, the entire contents of which are incorporated herein by reference.

BACKGROUND OF THE INVENTION

1. Field of the Invention

The present invention relates to a semiconductor device and a semiconductor integrated circuit, in particular, to an MIS (Metal Insulator Semiconductor) semiconductor device manufactured by using an SOI (Silicon On Insulator) device, for example, formed on an insulating film, and a semiconductor integrated circuit using the semiconductor device.

2. Description of the Related Art

In the field of MIS semiconductor devices, SOI devices attract a great deal of attention, since they have merits such as reduced parasitic capacitance and improved device current driving ability, and thus can realize a high-speed low power consumption LSI (Large Scale Integrated circuit). An SOI device also has other advantages such as being latch-up free and reducing soft errors, and thus has many merits in comparison with a bulk device that is the mainstream in the conventional art.

In present LSIs, a continuous clock signal is generated internally, and an operation of each circuit block is controlled in synchronization with the clock signal. However, the power required for continuously generating a clock signal is the dominant factor in the total power consumption of an LSI. Therefore, to reduce the power consumption of the whole LSI, it is very important to reduce the power consumed by the clock signals. Thus, a "Gated Clock circuit" attracts attention, which is a circuit connected to an unused circuit block for stopping a circuit that controls a clock signal from issuing a clock signal, and only generating a clock signal when necessary.

FIG. 7 schematically shows a function block of an LSI, which has a gated clock circuit. As shown in FIG. 7, a clock signal is supplied from a clock signal source 31 to clock distribution circuits 32a to 32e. The clock distribution circuits 32a to 32e supply a clock signal to respective function circuits 33a to 33e. When the function circuits 33a to 33e are in standby states, the clock distribution circuits stop supply of a clock signal to the standby function circuits, in response to a control signal (not shown).

In the future, a combination of the above SOI device technique with a gated clock circuit is expected to make a large contribution to lowering of power consumption of LSI's.

In the meantime, existing SOI MISFET (Metal Insulator Semiconductor Field Effect Transistor) devices are classified roughly into two types, that is, "Fully-Depleted" devices and "Partially-Depleted" devices. Fully-Depleted devices are of a type in which a semiconductor layer (body region) is fully depleted. In partially-depleted devices, a semiconductor layer is only partially depleted. Further, the term "partially-depleted device" indicates a transistor in which a semiconductor layer (body region) is only partially depleted when the transistor is on state.

Devices of these two types have respective merits and demerits, and it is desirable to select one of them according to the properties required of the circuit. However, under the present circumstances, it is technically difficult to control the film thickness of the SOI active layer of a fully-depleted device, in comparison with that of a partially-depleted device. Further, in the case of adopting a fully-depleted device, the threshold voltage of the transistor is dependent on fewer factors, such as film thickness of an SOI and film thickness of a gate insulating film. A limited choice of factors determining the threshold voltage makes it difficult to make various threshold values, although it has been recently required to make transistors with various threshold values. Further, there is a high demand for using a partially-depleted device in a circuit at present, since it also has a high driving power.

However, in a partially-depleted SOI device formed on an insulating film, it is difficult to form a well as in a conventional bulk device and fix its potential. Therefore, it is reported that there is the problem that the "body region" of the device comes into an electrically floating state, and thus the potential of the body region readily changes, which causes large fluctuations in the device properties (F. Assadaraghi et al., 1996 Symposium on VLSI Technology Digest of Technical Papers, p122).

As an example, the case where a gated clock circuit as described above is manufactured by using a partially-depleted SOI device will now be explained. The body potential of the device in a stopped state is determined by balance of a pn junction current flowing between its source, drain and body region. In the meantime, when the circuit starts operation, the body potential of the device transiently fluctuates due to the influence of capacitive coupling existing between the gate, source, drain and body region in addition to influence of the pn junction current. Although the body voltage directly after start of circuit operation is influenced by the potential (charge) in the stopped state of the circuit, the potential changes as the operation continues, and changes to a certain fixed value in the end. Therefore, until the body potential reaches a predetermined value, a drain current of the device fluctuates due to fluctuations of the body potential of the device. As a result, it causes a problem of fluctuations of the frequency of a clock signal supplied to circuits connected to the gated clock circuit (history effect).

Originally, the frequency of a clock signal generated in an LSI must be fixed. However, under the above conditions, a state continues wherein operation of the circuit block using the clock signal cannot be performed, until the frequency of the clock signal is fixed. Therefore, there is the problem that operation of an LSI delays.

BRIEF SUMMARY OF THE INVENTION

A semiconductor device according to the first aspect of the present invention comprises a semiconductor substrate, an insulating film provided on the semiconductor substrate, a semiconductor layer provided on the insulating film, a gate insulating film provided on the semiconductor layer, a gate electrode provided on the gate insulating film, a source region and a drain region formed in the semiconductor layer to hold a body region under the gate electrode therebetween, and a control section supplying a first voltage and a second voltage different from the first in an OFF state and ON state respectively. The second voltage being set such that a potential of the body region in the OFF state is substantially the same as a potential of the body region in the ON state.

DETAILED DESCRIPTION OF THE INVENTION

Figure 1:
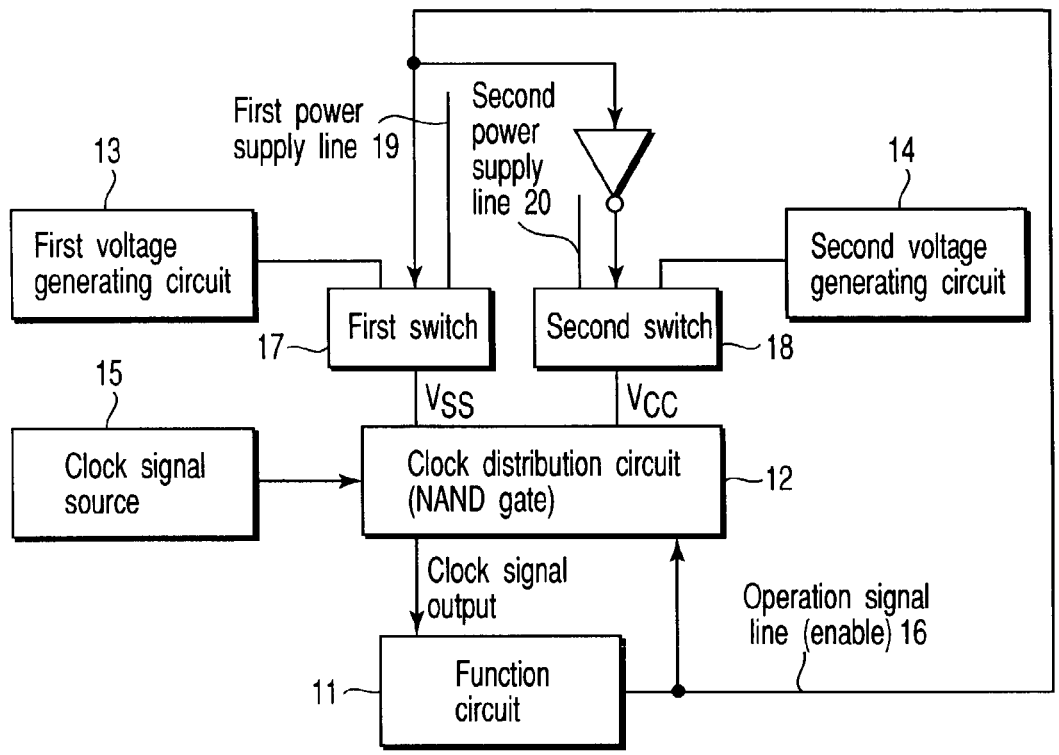
FIG. 1 is a block diagram illustrating a structure of a main part of a semiconductor integrated circuit according to a first embodiment of the present invention.

Embodiments of the present invention will now be described with reference to the drawings. In the following description, like reference numerals denote like devices having almost the same function and structure, and their explanations are repeated only if necessary.

(First Embodiment)

FIG. 1 is a block diagram illustrating a structure of a main part of a semiconductor integrated circuit according to a first embodiment of the present invention.

As shown in FIG. 1, the semiconductor integrated circuit according to the first embodiment has a function circuit 11 for executing predetermined data processing and signal processing using a static circuit or a dynamic circuit. The term "function circuit" indicates a circuit which operates on the basis of a clock signal and executes predetermined data processing and signal processing, for example. The function circuit 11 operates in response to a clock signal. A clock signal is generated by a clock signal source 15, and distributed to the function circuit 11 through a clock distribution circuit 12.

The clock distribution circuit 12 supplies and stops a clock signal to the function circuit 11, in response to an operation signal line (enable) 16. The operation signal line 16 controls the operation state of the function circuit 11. Stopping supply of a clock signal to the function circuit 11 can reduce power consumption when the function circuit 11 does not need a clock signal. A gate circuit such as a NAND gate can be adopted as a specific structure of the clock distribution circuit 12. A clock signal is supplied to the function circuit 11 by opening the gate of the clock distribution circuit 12, and supply of a clock signal is stopped by closing the gate. Consequently, the function circuit 11 shifts to a stand-by state.

At least a part of the clock distribution circuit 12 is formed by using an SOI device formed on an insulating film. Typically the whole semiconductor integrated circuit is formed of an SOI device.

The clock distribution circuit 12 is at a standstill when the function circuit 11 is in a stand-by state. In this state, when a signal is inputted in the function circuit 11 and a clock signal is needed, the clock distribution circuit 12 has to supply a clock signal to the function circuit 11. Therefore, a signal generating trigger is applied from the operation signal line 16 to the clock distribution circuit 12 to start operation of the clock distribution circuit 12, and thereby a clock signal is supplied to the function circuit 11.

A first voltage generating circuit 13 and a first power supply line 19 are connected to a first switch 17, and the first switch 17 is connected to the clock distribution circuit 12 through a power supply line Vss. A second voltage generating circuit 14 and a second power supply line 20 are connected to a second switch 18, and the second switch 18 is connected to the clock distribution circuit 12 through a power supply line Vcc. Their functions are described later.

As described above, a history effect occurs in a partially-depleted SOI device forming the clock distribution circuit 12. In other words, the operation of the clock distribution circuit 12 in the state of stopping distribution of a clock signal is in an unstable state for a while after starting its operation. This is due to difference between a body potential of the SOI device in a stopped state and a stable body potential of the SOI device during operation, as described above.

Figure 2:
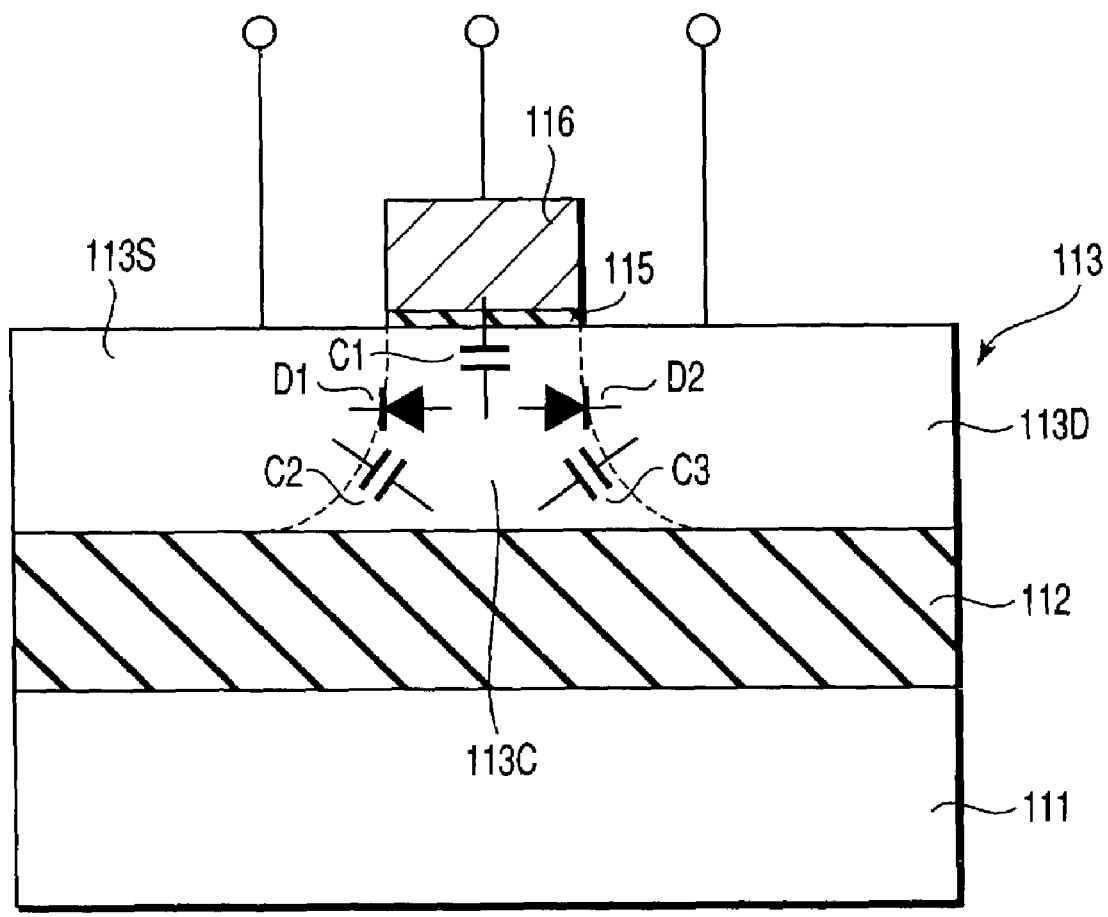
FIG. 2 is a schematic diagram illustrating a cross-sectional structure of a main part of an SOI device forming a clock distribution circuit.

FIG. 2 is a schematic diagram illustrating a cross-sectional structure of a main part of a conventional SOI device forming the clock distribution circuit. A semiconductor layer (SOI layer) 113 is provided on a semiconductor substrate 111 with an insulating film 112 interposed therebetween. The SOI layer 113 has a body region 113C under a gate insulating film 115, and a source region 113S and a drain region 113D located on both sides of the body region 113C.

In the state where a predetermined gate voltage is applied to a gate electrode 116 (ON state), a channel is formed in the body region 113C and an ON current flows therethrough. In the meantime, in the state where no gate voltage is applied (OFF state), the body region 113C falls into a state electrically close to a floating state. Specifically, as conceptually shown in FIG. 2, the body region 113C is coupled by parasitic capacitance C1 formed between gate 116 and body region 113C, coupled to the source region 113S by a parasitic diode D1 and parasitic capacitance C2, and coupled to the drain region 113D by a parasitic diode D2 and parasitic capacitance C3. Therefore, the potential of the body region 113C in an OFF state changes mainly according to the potentials of the source region 113S and the drain region 113D.

The inventors of the present invention evaluated the potential of the body region 113C of the SOI device in the case where the clock distribution circuit 12 as illustrated in FIG. 1 is formed of a NAND gate. As a result, in the case where the power supply potential was 1V, a steady value of the potential of the body region 113C in an ON state was approximately 0.5V, while a steady value of the potential of the body region 113C in an OFF state was approximately 0.3V.

In other words, there is a difference of 0.2V in the potential between the ON state and OFF state. As a result, when the circuit changes from an OFF state to ON state, a predetermined time is required for the potential of the body region 113C to reach the steady value, which causes fluctuations of the frequency. Further, the difference in the potential between the ON state and the OFF state differs according to the structure of the transistor. The above numerical values are only examples.

In the first embodiment of the present invention, a predetermined bias voltage is applied to the SOI device to maintain the potential of the body region in the OFF state at the steady value in the ON state. Specifically, as illustrated in FIG. 1, a predetermined bias voltage is applied to the SOI device of the clock distribution circuit 12 by the first voltage generating circuit 13 and the second voltage generating circuit 14, in the state where a clock signal is stopped.

Specifically, signals from the operation signal line 16 are sent to the first switch 17 and the second switch 18. While the function circuit 11 and the clock distribution circuit 12 operate, the power supply line of the clock distribution circuit 12 is controlled to be connected to the first power supply line 19 and the second power supply line 20. In the meantime, in the state where the function circuit 11 and the clock distribution circuit 12 do not operate, the power supply line of the clock distribution circuit 12 is controlled to be connected to the first voltage generating circuit 13 and the second voltage generating circuit 14. In other words, by controlling the voltage of the power supply line, a proper current is made to flow through each of the parasitic diodes D1 and D2 of the SOI device as illustrated in FIG. 2, and thereby the potential of the body region of the device at a standstill is controlled to be almost equal to the steady value in the ON state.

The above can be achieved by predetermining potentials generated by the first and second voltage generating circuits 13 and 14 by operation experiments and simulation, etc., such that the body potential of the SOI device to be connected to them is almost equal to its potential in a stable state. Therefore, the body potential in the steady state of the device being operated is determined by simulation, and this potential can be adopted as the body potential when the device is not operated. Further, it is not always necessary to apply a bias to both of the source and drain to control the body potential of the SOI device in the OFF state. Specifically, the body potential may be controlled by applying a predetermined bias voltage to only either the source or drain.

Each circuit operating as the function blocks shown in FIG. 1 can be typically realized on a LSI. A voltage for controlling the body potential of the OFF state SOI device, however, is not necessarily generated by the voltage generating circuits 13 and 14 formed. Otherwise, the voltage can be applied directly from outside of the LSI.

In the prior art, as described above, a clock signal supplied directly after start of operation of the clock distribution circuit 12 following a standstill state cannot be used since its frequency is unstable due to history effect. Therefore, it is necessary to stop signal processing of the function circuit 11 until its frequency is stable, which delays the circuit operation.

In comparison with this, according to the first embodiment, fluctuations of a clock signal due to the history effect can be inhibited. Therefore, operation of the clock distribution circuit 12 can be started at the time to start operation of the function circuit 11. This enables reduction in the margin at the time of design, and high-speed operation of the semiconductor integrated circuit.

Figure 7:
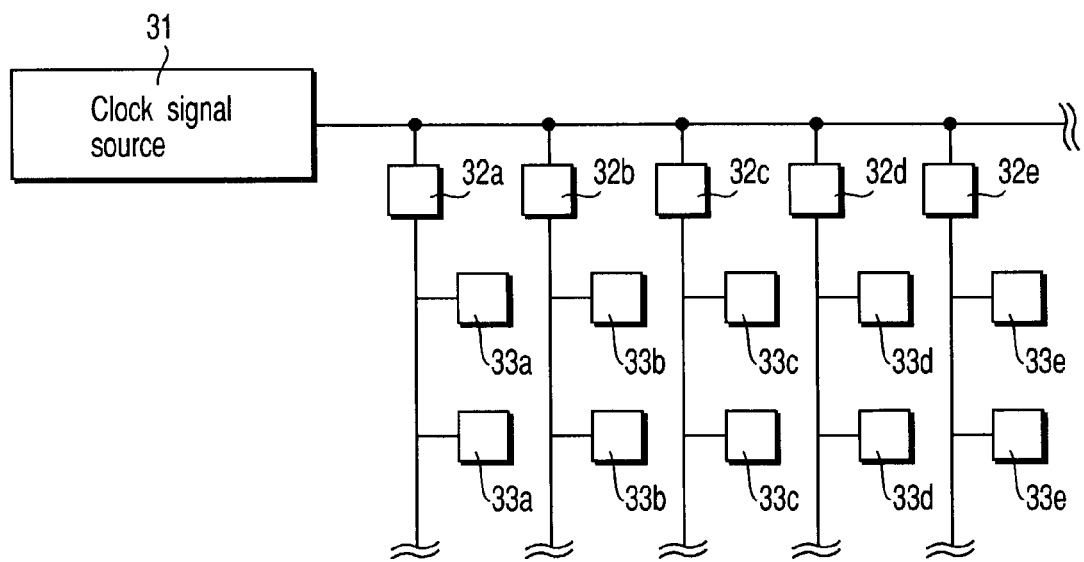
FIG. 7 is a diagram schematically showing function blocks of an LSI having a gated clock circuit.

Further, since a clock signal directly after start of the clock distribution circuit 12 is stable, the signal can be used immediately, and high-speed circuit operation can be achieved. Therefore, the first embodiment is effective, for example, in a circuit which starts its operation by detecting the initial rising or falling edge of a clock signal. Specifically, the first embodiment is especially effective, for example when applied to the circuit structure illustrated in FIG. 7 and a stand-by releasing signal to the function blocks 33a to 33e in a stand-by state are an initial pulse of a clock signal.

Next, a specific example of a semiconductor device which can be used in a semiconductor integrated circuit according to the first embodiment of the present invention will now be described.

Figure 3:
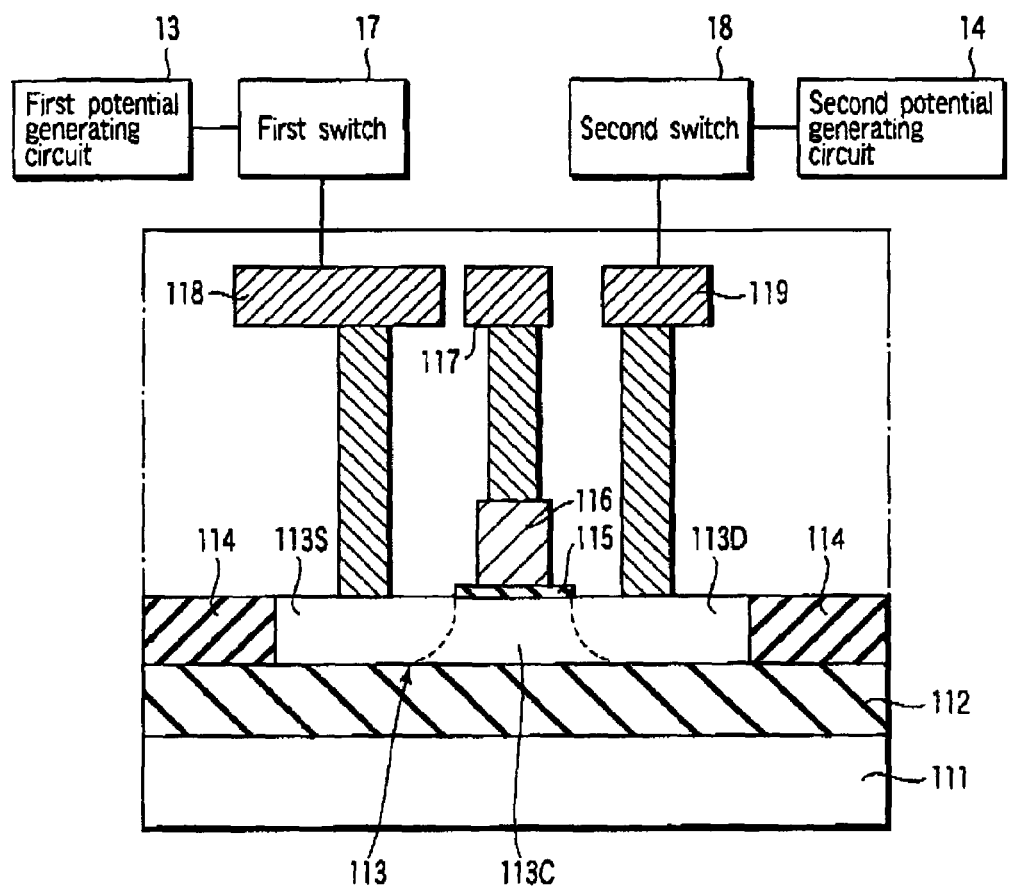
FIG. 3 is a schematic diagram illustrating a cross-sectional structure of a semiconductor device which can be used in a semiconductor integrated circuit according to the first embodiment of the present invention.

FIG. 3 is a schematic diagram illustrating a cross-sectional structure of a semiconductor device which can be used in a semiconductor integrated circuit according to the first embodiment of the present invention. The semiconductor device has an FET (SOI device) which operates in a partially depleted state. As shown in FIG. 3, the FET is formed in a semiconductor layer (SOI layer) 113 laminated on a silicon (Si) substrate 111 with an insulating film 112 interposed therebetween. The SOI layer 113 is separated in an island form by device-separating insulating films 114. Further, a gate electrode 116 is provided on the SOI layer 113 with a gate insulating film 115 interposed therebetween, and a gate wire 117 is formed on the gate electrode 116. Furthermore, a source electrode 118 and a drain electrode 119 are connected to a source region 113S and drain region 113D, respectively, on both sides of the SOI layer 113.

The structure of the semiconductor device illustrated in FIG. 3 will now be described in more detail, with reference to its manufacturing process.

FIG. 4 is a cross-sectional view illustrating steps for manufacturing a main part of the semiconductor device illustrated in FIG. 3.

Figure 4A:
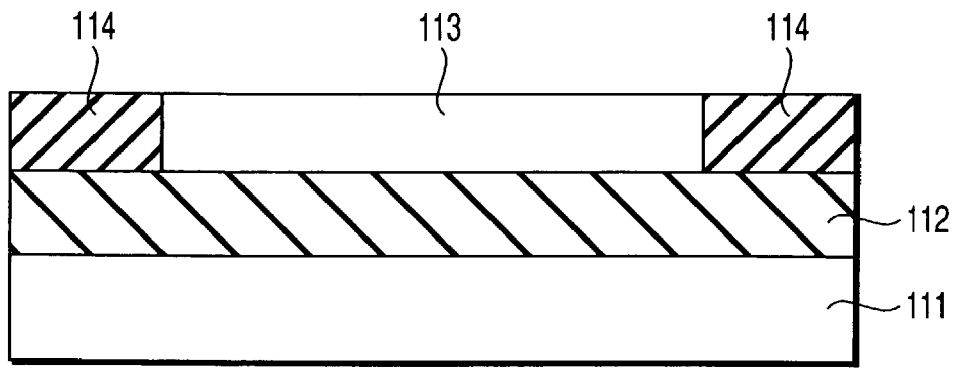
FIGS. 4A, 4B, and 4C are cross-sectional views illustrating steps for manufacturing a main part of an FET illustrated in FIG. 3.

First, as shown in FIG. 4A, the SOI layer 113 is separated as a device. Specifically, an SOI layer 113 is formed on the silicon semiconductor substrate 111, with a BOX (Buried Oxide) 112 formed of a silicon oxide film or the like, by a method such as SIMOX (Separation by Implantation of Oxygen) and bonding. Next, the SOI layer 113 is made thin to a desired thickness, such as 150 nm, by thermal oxidation and etching with $NH_4F$, for example.

Next, device-separating insulating films 114 are formed by STI (Shallow Trench Isolation), for example. An SOI device is electrically separated from other SOI devices by the device-separating insulating films 114.

Figure 4B:
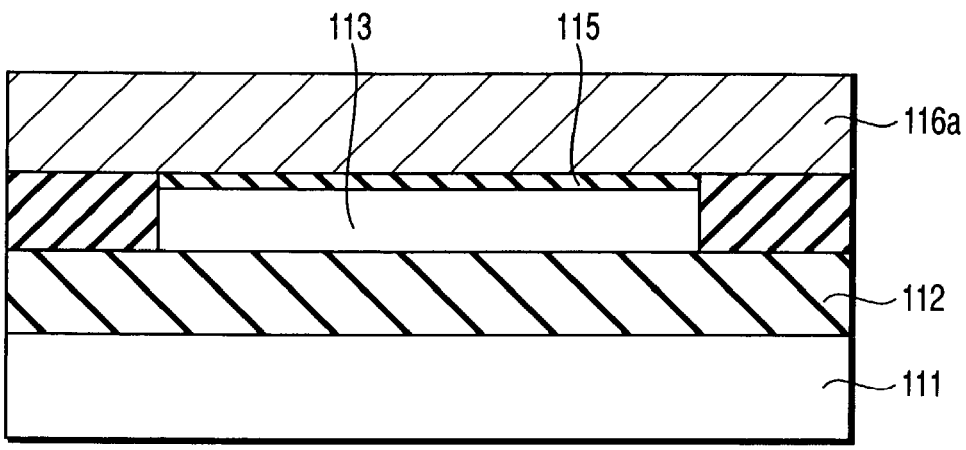

Next, as shown in FIG. 4B, a gate insulating film and a gate electrode are formed. Specifically, impurities for adjusting a device threshold voltage are injected into the SOI layer 113 by ion implantation, for example. Thereafter, a gate insulating film 115 is formed on the SOI layer 113 by thermal oxidation, for example, and a polycrystalline silicon, for example, is deposited thereon with a desired film thickness by CVD (Chemical Vapor Deposition) to form a gate electrode material 116a.

Figure 4C:
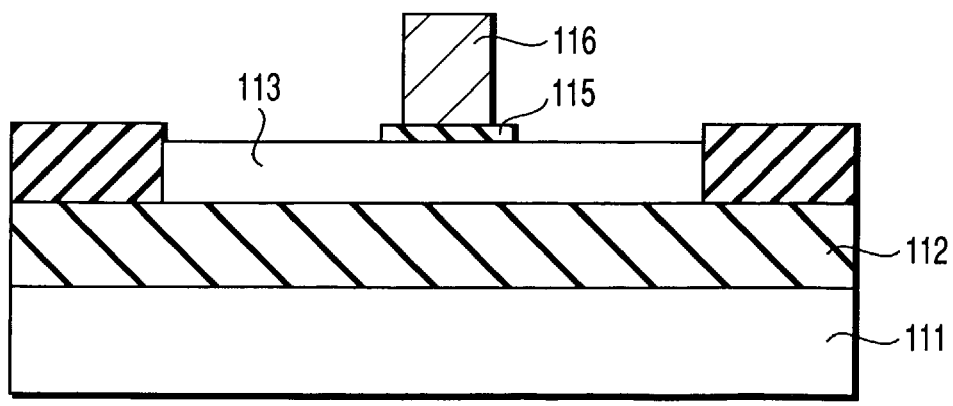

Then, as shown in FIG. 4C, the polycrystalline Si on the source and drain regions is removed by using RIE (Reactive Ion Etching), for example, with a resist used as a mask. Thereafter, impurities are injected into the gate, source and drain regions formed as described above, by ion implantation or the like. Then, a heat process for activating the impurities injected by ion implantation, such as anneal using RTA (Rapid Thermal Annealing), is performed.

Next, an interlayer insulating film is deposited, and a gate wire 117, a source electrode 118 and a drain electrode 119 are formed, which are connected by wire to the gate electrode 116, a source 113S, and a drain 113D, respectively. Then, a desired multilayer wire is formed according to necessity, to obtain a partially-depleted SOI device as shown in FIG. 3.

According to the first embodiment of the present invention, a predetermined bias voltage is applied to a circuit formed by using a partially-depleted SOI device formed as described above, when the circuit is at a standstill. Consequently, its body potential can be equal to a potential at a regular operation, and it is possible to solve a transient state at the time of restarting the operation.

Incidentally, in recent years, as semiconductor devices are made more minute, film thicknesses of gate insulating films are being made thinner. As gate insulating films are made thinner, the problem of a tunnel leakage current flowing between the gate electrode and the channel becomes more striking. In a partially-depleted SOI device, if a body region is operated in a floating state, a tunnel leakage current from a gate electrode reaches the body region, and fluctuates the body potential. As described above, presence/absence of a tunnel leakage current has a great influence on the body potential. If a silicon oxynitride film material is used as a gate insulating film, this problem becomes especially striking in the case of using a gate insulating film with a film thickness of not exceeding 3 nm.

In order to inhibit fluctuations of the body potential, a method such as adjusting the film thickness of the SOI layer has been adopted, as described on pages 122–123 of the Abstract of 2000 IEEE International SOI Conference. Specifically, it teaches that reducing the film thickness of the SOI layer is effective against increase in the tunnel leakage current value with thinning of the gate insulating film. However, thinning an SOI layer causes a problem that a depletion layer extending from the gate electrode side reaches the buried insulating film and the SOI device is made fully-depleted. Specifically, this method has limits to inhibit fluctuations of the body potential of an SOI device while avoiding the possibility of making the SOI device fully-depleted.

In comparison with this, according to the first embodiment of the present invention, even when the film thickness of the gate insulating film made of an oxynitride film material is 3 nm or less, it is possible to inhibit fluctuations of the body potential of an SOI device with the SOI device partially-depleted.

Whether the SOI device is fully-depleted or partially-depleted depends on the impurity density in the body region and the film thickness of the SOI layer, or the like. The SOI device operates as a partially-depleted device when it satisfies the following relation:

$$T_{soi} > \sqrt{\frac{4 \cdot \varepsilon_S \cdot k \cdot T \cdot \ln(N_a/N_i)}{q^2 \cdot N_a}}$$

$T_{soi}$: film thickness of SOI layer,
$\in_s$: dielectric constant of silicon,
k: Boltzmann constant, T: absolute temperature,
$N_a$: impurity density of body region,
$N_i$: intrinsic carrier density,
q: elementary charge For example, a partially-depleted SOI device can be obtained by setting $T_{soi}$ to 150 nm and Na to $1 \times 10^{17}$ cm$^{-2}$.

Further, recently, it has been studied to adopt a high-k material as a gate insulating film, since a tunnel leakage current causes increase of power consumption of an LSI and degradation of performance. Using a gate insulating film made of a high-k material can reduce a tunnel leakage current to almost zero. However, the film thickness of an SOI layer must be extremely thickened in compliance with adopting a high-k material. Further, since the film thickness of an SOI layer is limited, it is very difficult to absorb all fluctuations of a gate tunnel leakage current. Therefore, it is insufficient as a practical solution.

In comparison with this, according to the first embodiment of the present invention, regardless of the material of a gate insulating film, or without being affected by a problem caused by the material of the gate insulating film, it is possible to inhibit fluctuations of the body potential of an SOI device. Therefore, high-k material can be used as a gate insulating film, needless to say about silicon oxide, silicon nitride, and silicon oxynitride. Further, the film thickness of the SOI does not have to be increased, and it is possible to maintain an advantage of low diffusion layer capacitance that is original trait of SOI device.

Even in the case of using a gate insulating film of a high-k material, it is impossible to inhibit increase in the coupling capacitance between the gate electrode and the channel. According to the first embodiment of the present invention, it is possible to inhibit a problem due to a coupling capacitance also in the case of using a gate insulating film of a high-k material.

In the case of using a gate insulating film of a high-k material, polysilicon or metal material is used as a gate electrode. However, the first embodiment of the present invention is applicable regardless of the material of the gate electrode.

(Second Embodiment)

Figure 5:
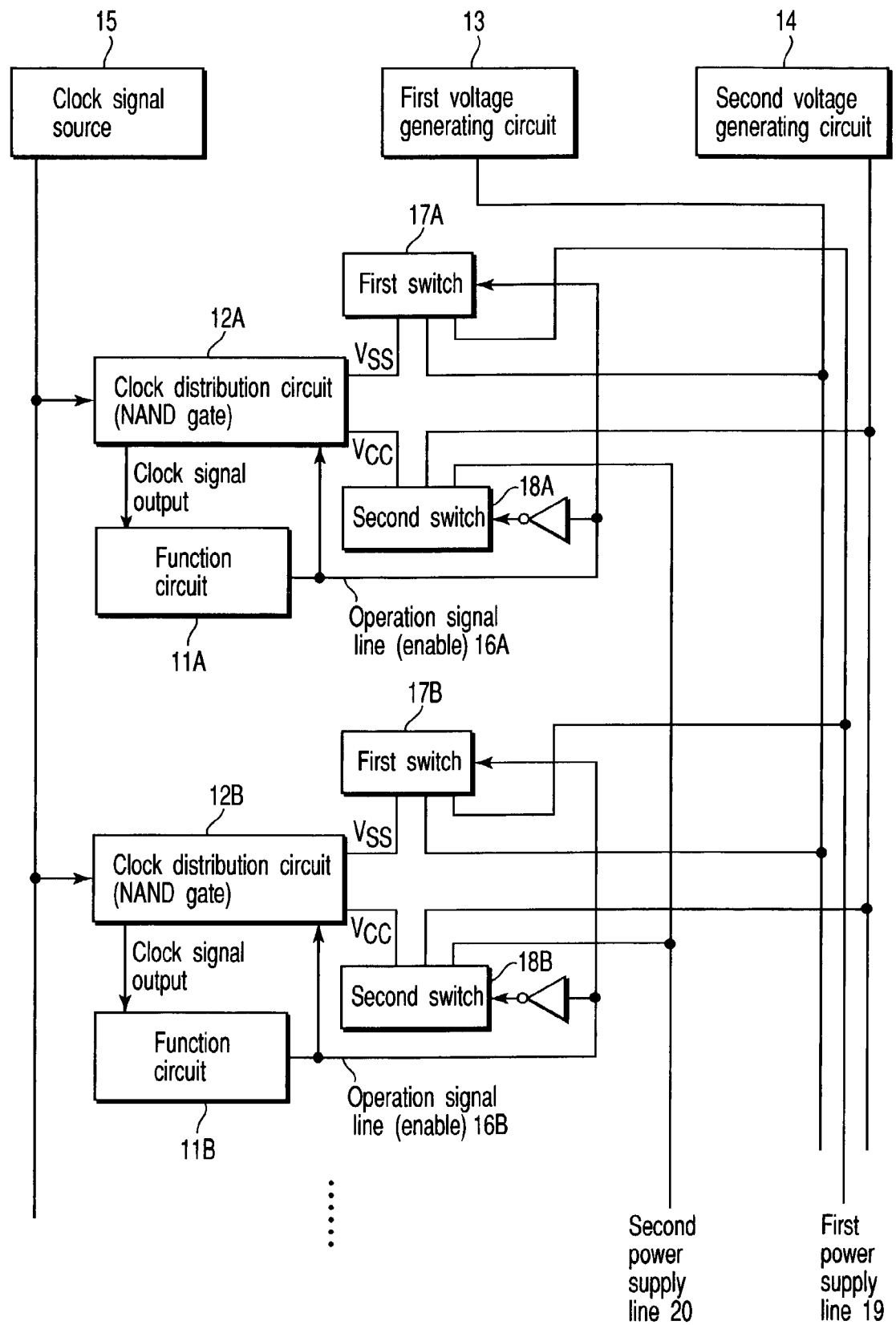
FIG. 5 is a block diagram illustrating a structure of a main part of a semiconductor integrated circuit according to a second embodiment of the present invention.

FIG. 5 is a block diagram illustrating a structure of a main part of a semiconductor integrated circuit according to a second embodiment of the present invention. In the second embodiment, a plurality of sets of clock distribution systems each comprise the function circuit and the clock supply system illustrated in FIG. 1. The structure of an SOI device forming the clock distribution circuit according to the second embodiment is the same as that of the first embodiment.

As shown in FIG. 5, a semiconductor integrated circuit according to the second embodiment has a plurality of function circuits 11A, 11B . . . . Clock distribution circuits 12A, 12B . . . for distributing a clock signal are connected to respective function circuits. The clock distribution circuits perform supply and stop of a clock signal from a clock signal source 15 in response to control signals from operation signal lines 16A, 16B . . . .

The clock distribution circuits 12A, 12B . . . are connected to respective first switches 17A, 17B . . . through respective power supply lines $V_{SS}$, and connected to respective second switches 18A, 18B . . . through respective power supply lines $V_{CC}$. The first switches 17A, 17B . . . selectively connect the clock distribution circuits 12A, 12B . . . , respectively, to a first power supply line 19 or a first voltage generating circuit 13. The second switches 18A, 18B . . . selectively connect the clock distribution circuits 12A, 12B . . . , respectively, to a second power supply line 20 or a second voltage generating circuit 14. Therefore, the potentials supplied to the block distribution circuits 12A, 12B . . . can be controlled according to the operation state of the respective clock distribution circuits 12A, 12B . . . .

According to the second embodiment, it is possible to obtain effects similar to those of the first embodiment. Further, since function circuits 11A, 11B . . . are provided to respective plural clock distribution circuits 12A, 12B . . . , the potentials to be supplied can be controlled in accordance with operations of the respective clock distribution circuits 12A, 12B . . . . Therefore, it is possible to perform supply and stop of a clock signal in accordance with operations of the respective function circuits 11A, 11B . . . .

(Third Embodiment)

Figure 6:
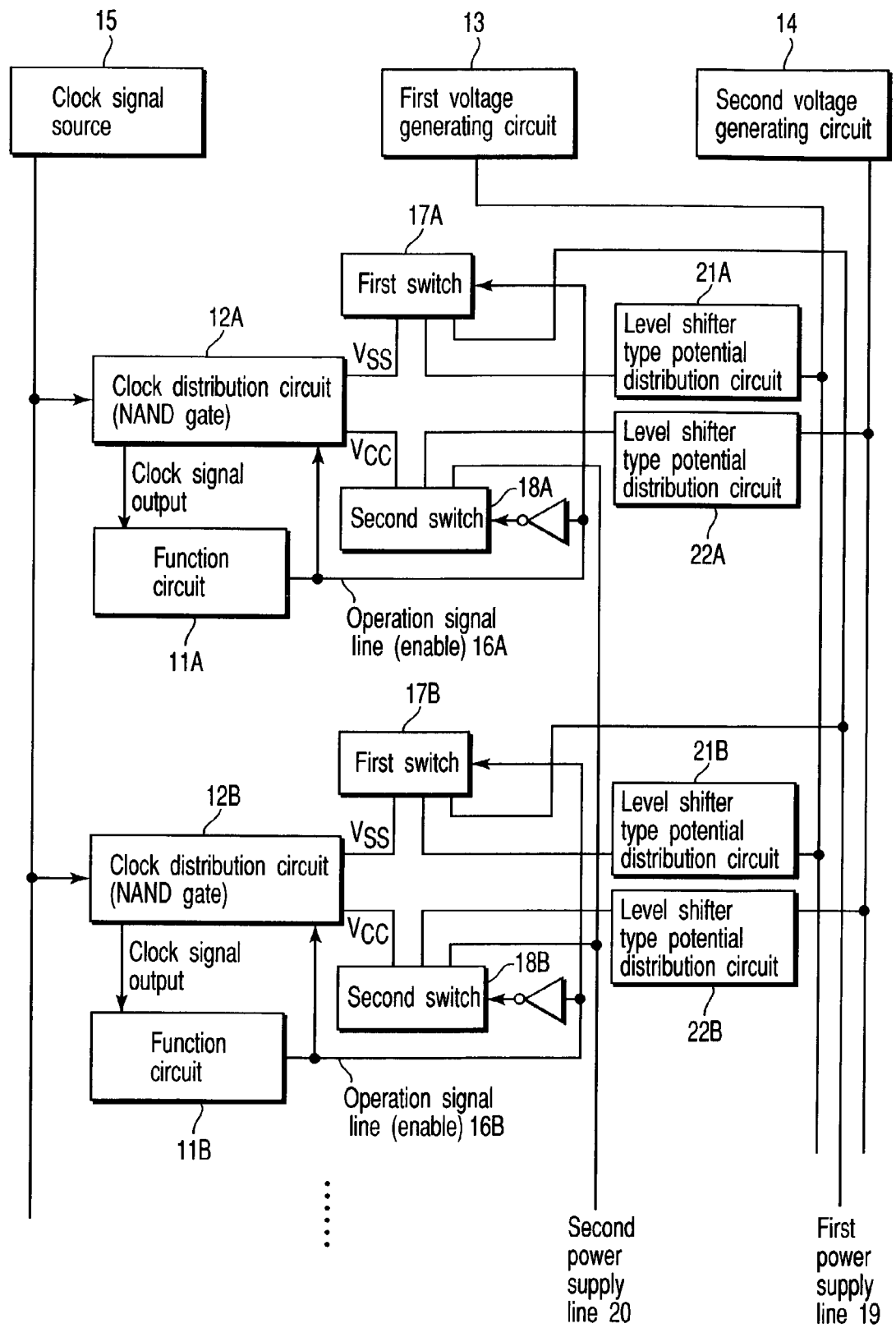
FIG. 6 is a block diagram illustrating a structure of a main part of a semiconductor integrated circuit according to a third embodiment of the present invention.

FIG. 6 is a block diagram illustrating a structure of a main part of a semiconductor integrated circuit according to a third embodiment of the present invention. The structure of an SOI device forming a clock distribution circuit according to the third embodiment is the same as that of the first embodiment.

As shown in FIG. 6, also in the third embodiment, a plurality of function circuits 11A, 11B, . . . are provided, and a clock signal is distributed thereto individually by respective clock distribution circuits 12A, 12B . . . . However, in the third embodiment, the voltage to be supplied to each clock distribution circuit in a standstill state differs between the clock distribution circuits.

Specifically, level shifter type potential distribution circuits 21A, 22A, 21B, 22B, . . . are connected between the respective first and second switches connected to the respective clock distribution circuits and the first and second voltage generating circuits, respectively. Each of the level shifter type potential distribution circuits individually changes voltages generated by the first and second voltage generating circuits, and enables supplying voltage different from those supplied to the other clock distribution circuits to the corresponding clock distribution circuit.

According to the third embodiment, it is possible to obtain effects similar to those of the first embodiment. Further, voltages to be supplied in a standstill state required for respective circuit blocks can be generated at discretion from the common voltage generating circuits 13 and 14. Therefore, the body potential can be individually set for each transistor.

The potential distribution circuit 21A provided between the first voltage generating circuit 13 and the first switch 17 does not always have to have the same structure as that of the potential distribution circuit 22A provided between the second voltage generating circuit 14 and the second switch 18. Specifically, the potential distribution circuits can differ from each other in the resistance division constant.

Embodiments of the present invention have been explained above with reference to examples. However, the present invention is not limited to these specific examples.

For example, even if the circuit structure of the semiconductor integrated circuit is changed according to its use and object, the present invention can be applied in the same manner and similar advantageous effects can be obtained. These are also included in the scope of the present invention.

For example, although a clock distribution circuit has been explained as a specific example in the above explanation, the present invention is not limited to this. The present invention is applicable to various circuits including a problem of history effect of an SOI device, where similar advantageous effects can be obtained.

Further, in the first to third embodiments, as a specific method of applying a predetermined bias voltage to a circuit at standstill, a method of applying a voltage through the power supply lines $V_{SS}$ and $V_{CC}$, as shown in FIG. 1, etc. is shown. However, the present invention is not limited to this, and the body potential may be controlled by applying a bias to the SOI device through a route other than the power supply lines $V_{SS}$ and $V_{CC}$, for example.

Furthermore, with respect to design parameters such as the process for forming the SOI device and the structure or the material of the device, the same advantageous effects can be obtained even if one skilled in the art changes them in a known range according to necessity to carry out the invention, and these are also included in the present invention. Specifically, one skilled in the art can change the material of devices constituting the FET, conductivity type of the semiconductor layer, kind of added impurities, carrier density and layer thickness, according to necessity, and similar effects can be obtained.

Moreover, although a MOSFET using an SOI substrate was mentioned in the above explanation, the present invention is not limited to this, and it is possible to use a substrate such as SOS (Silicon On Sapphire).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit comprising:
a clock signal source which outputs a clock signal;
a clock distribution circuit section comprising a transistor, a first power line and a second power line, the clock distribution circuit section supplied with the clock signal and selectively outputting the clock signal in response to an operation of the transistor, the transistor comprising a semiconductor substrate, an insulating film provided on the semiconductor substrate, a semiconductor layer provided on the insulating film, a gate insulating film provided on the semiconductor layer, a gate electrode provided on the gate insulating film, a source region and a drain region formed in the semiconductor layer to hold a body region under the gate electrode therebetween;
a first potential line having a first potential, the first potential being set such that a potential of the body region in an OFF state of the transistor is the same as a potential of the body region in an ON state of the transistor; and
a first switch connecting the first power line to the first potential line in the OFF state.

2. A semiconductor integrated circuit according to claim 1, further comprising
a function circuit section supplied with the clock signal from the clock distribution circuit section and operating in response to the clock signal.

3. A semiconductor integrated circuit according to claim 1, wherein the semiconductor integrated circuit has a thickness of the semiconductor layer and impurity density of the body region set to prevent a depletion layer of the body region from reaching the insulating film in the ON state of the semiconductor device.

4. A semiconductor integrated circuit according to claim 1, wherein the transistor satisfies the following relation:

$$T_{soi} > \sqrt{\frac{4 \cdot \varepsilon_S \cdot k \cdot T \cdot \ln(N_a / N_i)}{q^2 \cdot N_a}}$$

$T_{SOI}$: film thickness of SOL layer,
$\varepsilon_s$: dielectric constant of silicon,
k: Boltzmann constant, T: absolute temperature,
$N_a$: impurity density of body region,
$N_i$: intrinsic carrier density,
q: elementary charge.

5. A semiconductor integrated circuit according to claim 1, wherein the gate insulating film has a film thickness of 3 nm or less.

6. A semiconductor integrated circuit according to claim 1, wherein the gate insulating film consists of a material selected from the group consisting of silicon oxide, silicon nitride, silicon oxynitride, and a high-k material.

7. A semiconductor integrated circuit according to claim 1 further comprising:
 a second potential line having a second potential, the second potential being set such that the potential of the body region in the OFF state is as same as the potential of the body region in the ON state; and
 a second switch connecting the second power line to the second potential line in the OFF state.

8. A semiconductor integrated circuit according to claim 7 further comprising:
 a first power supply line, the first switch connecting the first power line to the first power supply line in the ON state; and
 a second power supply line, the second switch connecting the second power line to the second power supply line in the ON state.

9. A semiconductor integrated circuit according to claim 7 further comprising:
 a first voltage generating circuit connected to the first potential line and supplying the first potential line with the first potential; and
 a second voltage generating circuit connected to the second potential line and supplying the second potential line with the second potential.

10. A semiconductor device comprising:
 a semiconductor substrate;
 an insulating film provided on the semiconductor substrate;
 a semiconductor layer provided on the insulating film;
 a gate insulating film provided on the semiconductor layer;
 a gate electrode provided on the gate insulating film;
 a source region and a drain region formed in the semiconductor layer to hold a body region under the gate electrode therebetween;
 a first voltage generating circuit configured to generate a first voltage, the first voltage having a value which sets a potential of the body region in an OFF state to a potential of the body region in an ON state when the first voltage is applied to the source region or the drain region;
 a first switch connecting one of the source region and the drain region to the first voltage generating circuit in the OFF state;
 a second voltage generating circuit configured to generate a second voltage, the second voltage having a value which sets a potential of the body region in an OFF state to a potential of the body region in an ON state when the second voltage is applied to the source region or the drain region; and
 a second switch connecting another one of the source region and the drain region to the second voltage generating circuit in the OFF state.

* * * * *